United States Patent
Pronin

(10) Patent No.: US 7,224,160 B1
(45) Date of Patent: May 29, 2007

(54) RF AND PULSE BIAS TEE

(75) Inventor: Alexander N. Pronin, Twinsburg, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/358,592

(22) Filed: Feb. 21, 2006

(51) Int. Cl.
*G01R 31/28* (2006.01)

(52) U.S. Cl. .................................... 324/158.1; 324/523

(58) Field of Classification Search ............... None
See application file for complete search history.

(56) References Cited

U.S. PATENT DOCUMENTS

| | | | |
|---|---|---|---|
| 4,816,767 A | 3/1989 | Cannon et al. | |
| 6,396,298 B1 * | 5/2002 | Young et al. | 324/769 |
| 6,628,176 B1 * | 9/2003 | Okada | 333/32 |
| 6,812,714 B2 | 11/2004 | Verspecht et al. | |
| 2007/0007972 A1 * | 1/2007 | Knauer | 324/677 |

OTHER PUBLICATIONS

Efficient Microwave Bias and Testing Using the HP 4142B Modular DC Source/Monitor, Hewlett Packard, Application Note 1205 (No Month/Date/Year available).

* cited by examiner

*Primary Examiner*—Ha Tran Nguyen
*Assistant Examiner*—Richard Isla-Rodas
(74) *Attorney, Agent, or Firm*—Pearne & Gordon LLP

(57) ABSTRACT

A RF and pulse bias tee for use with a source measure unit (SMU) includes a SMU source terminal; a SMU measure terminal; an output terminal; a SMU measure terminal pulse/RF block between the SMU measure terminal and the output terminal; a SMU source terminal high frequency block having two end nodes and an intermediate node, the end nodes being connected between the SMU source terminal and the output terminal; a RF input; a pulse/DC block between the RF input and the output terminal; a pulse input; and a DC block between the pulse input and the intermediate node.

7 Claims, 2 Drawing Sheets

RF AND PULSE BIAS TEE

BACKGROUND OF THE INVENTION

The present invention relates to the testing of electronic components and, in particular, to the testing of components in DC, RF and pulsed regimes.

In some necessary measurements, a device may not be able to withstand continuous application of the DC and/or RF signals employed. In other cases, at minimum, the continuous application of the signals may produce heating of the device under test (DUT), resulting in measurement errors. To overcome this limitation, it is known to pulse the signals so that the average power applied is within tolerable limits.

In the typical prior art approach to making RF and DC measurements on the same nodes of the DUT, switches are included in the test path to switch the RF and DC test instruments in and out of the circuit as appropriate. In high precision measurements, this results in errors and/or calibration difficulties. This is further compounded in the case of pulsed measurements.

High precision DC test signals are typically applied/measured with source measure units (SMUs). An SMU can very accurately source a current or voltage and measure the result.

SUMMARY OF THE INVENTION

A RF and pulse bias tee for use with a source measure unit (SMU) includes a SMU source terminal; a SMU measure terminal; an output terminal; a SMU measure terminal pulse/RF frequency block between the SMU measure terminal and the output terminal; a SMU source terminal high frequency block having two end nodes and an intermediate node, the end nodes being connected between the SMU source terminal and the output terminal; a RF input; a pulse/DC block between the RF input and the output terminal; a pulse input; and a DC block between the pulse input and the intermediate node.

DESCRIPTION OF THE PREFERRED EMBODIMENTS

Figure 1:
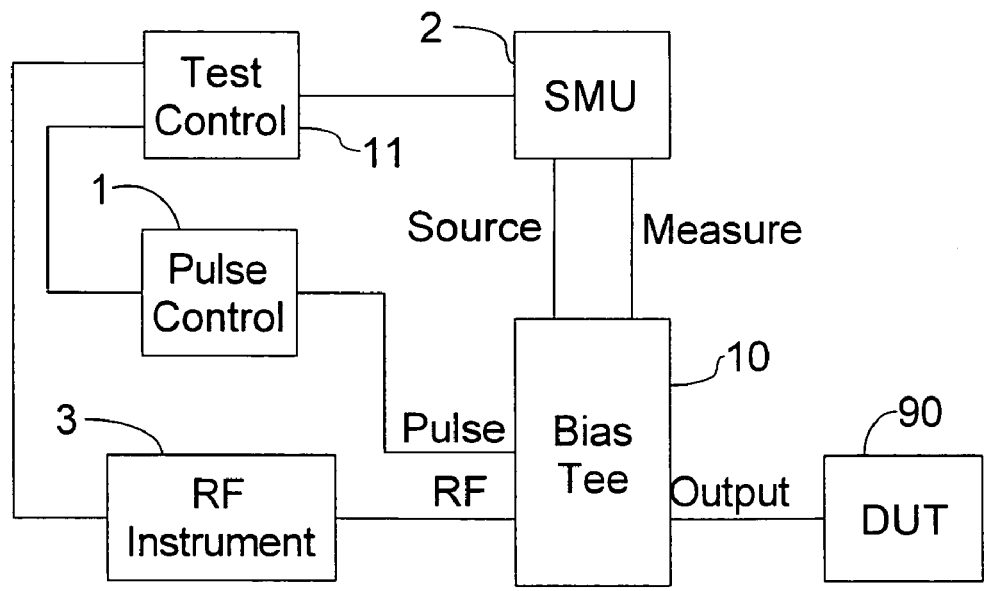
FIG. 1 is a block diagram of an example of a RF and pulse bias tee according to the invention in a testing circuit.

Referring to FIG. 1, a pulse control 1, a SMU 2 and a RF instrument 3 are provided for testing devices. The pulse control 1 provides pulses to a pulse input of a RF and pulse bias tee 10 according to a desired pulse repetition rate and other pulse characteristics. The SMU 2 has a source terminal and a measure terminal connected to respective source and measure terminals on the bias tee 10. The RF instrument 3 has a RF output connected to a RF input on the bias tee 10. The bias tee 10 has an output connected to a DUT 90.

The bias tee 10 keeps DC from the SMU 2 out of the RF instrument 3 and the pulse control 1. The bias tee 10 keeps RF from the RF instrument 3 out of the SMU 2 and the pulse control 1. The bias tee 10 also keeps the pulse train from the pulse control 1 out of the SMU 2 and the RF instrument 3. Meanwhile, the bias tee 10 allows any of the input signals to be applied to the DUT 90. The test controller 11 controls the operation of the pulse control 1, the SMU 2 and the RF instrument 3.

Figure 2:
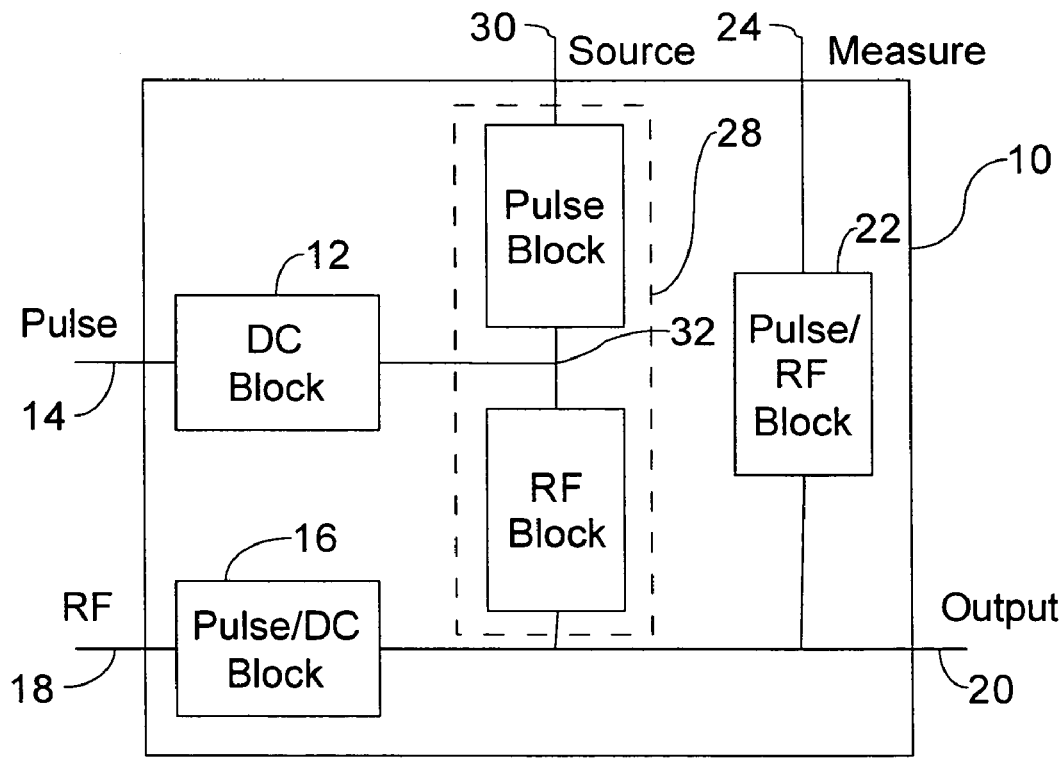
FIG. 2 is a block diagram of a RF and pulse bias tee according to the invention.

Referring to FIG. 2, the bias tee 10 includes a DC block 12 at the pulse input 14 that blocks DC coming from the SMU terminals 30, 34, while passing pulsed signals. The bias tee 10 also has a pulse/DC block 16 at the RF input 18 that blocks DC coming from the SMU terminals and pulses coming from the pulse input 14, while passing RF signals to the output 20.

A pulse/RF block 22 suitable for blocking both the RF from the RF input 18 and the pulse train frequency content from the pulse input 14 is connected between the SMU measure terminal 24 and the output terminal 20.

A high frequency block 28 for blocking both the RF from the RF input 18 and the pulse train frequency content from the pulse input 14 is connected between the SMU source terminal 30 and the output terminal 20. In addition, the high frequency block 28 has an intermediate node 32 connected to the DC block 12 that blocks pulse frequencies from reaching the SMU source terminal 30 while maintaining phase synchronism between the signals. The net effect is not only isolation of the signals to the desired locations, but also significant cancellation of harmonics, further improving performance.

Figure 3:
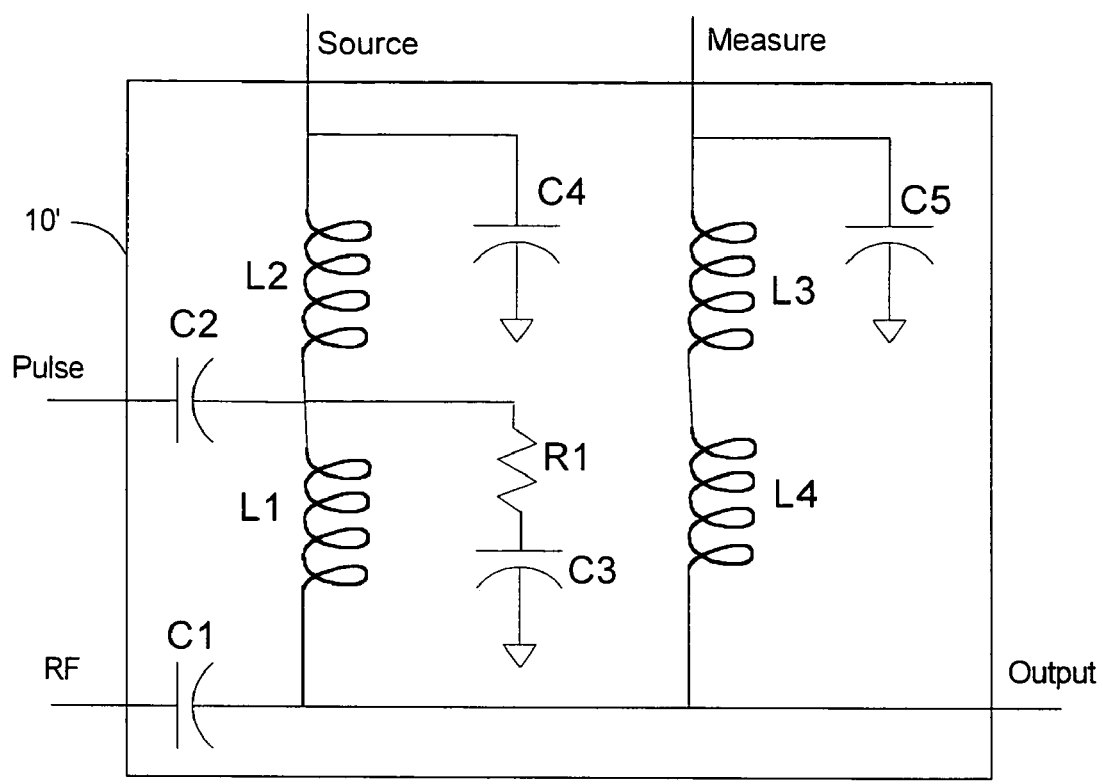
FIG. 3 is a schematic diagram of one example of a RF and pulse bias tee according to the invention.

Referring to FIG. 3, a specific example of the bias tee 10' is shown where C1=10 pF, C2=100 nF, C3=10 pF, C4=100 nF, C5=100 nF, L1=60 nH, L2=0.1 mH, L3=0.1 mH, L4=5 µH and R1=50 Ohm. The R1–C3 combination provides a pulse 50 ohm termination to improve pulse performance and to avoid reflections and pulse leakage into DC and RF parts of the circuit. This is example is suitable for making pulse I-V and RF performance measurements on semiconductors using the same test pins.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A RF and pulse bias tee for use with a source measure unit (SMU), said bias tee comprising:
    a SMU source terminal;
    a SMU measure terminal;
    an output terminal;
    a SMU measure terminal pulse/RF frequency block between said SMU measure terminal and said output terminal;
    a SMU source terminal high frequency block having two end nodes and an intermediate node, said end nodes being connected between said SMU source terminal and said output terminal;
    a RF input;
    a pulse/DC block between said RF input and said output terminal;
    a pulse input; and
    a DC block between said pulse input and said intermediate node.

2. A bias tee according to claim 1, wherein said DC block includes a series capacitance.

3. A bias tee according to claim 1, wherein said pulse/DC block includes a series capacitance.

4. A bias tee according to claim 1, wherein said SMU measure terminal pulse/RF block includes a series inductance.

5. A bias tee according to claim 4, wherein said SMU measure terminal pulse/RF block includes an inductor-capacitor network.

6. A bias tee according to claim 1, wherein said SMU source terminal high frequency block includes an inductance in series with another impedance, said intermediate node connecting said inductance and impedance.

7. A bias tee according to claim 6, wherein said SMU measure terminal pulse/RF block includes an inductor-capacitor network.

\* \* \* \* \*